United States Patent
Tanzawa et al.

(10) Patent No.: US 10,242,742 B2
(45) Date of Patent: Mar. 26, 2019

(54) SEGMENTED MEMORY AND OPERATION

(71) Applicant: MICRON TECHNOLOGY, INC., Boise, ID (US)

(72) Inventors: Toru Tanzawa, Tokyo (JP); Han Zhao, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/690,497

(22) Filed: Aug. 30, 2017

(65) Prior Publication Data

US 2018/0053552 A1 Feb. 22, 2018

Related U.S. Application Data

(63) Continuation of application No. 15/241,740, filed on Aug. 19, 2016, now Pat. No. 9,773,553.

(51) Int. Cl.
G11C 16/08 (2006.01)
G11C 16/04 (2006.01)
G11C 16/10 (2006.01)
G11C 16/26 (2006.01)

(52) U.S. Cl.
CPC ......... *G11C 16/0483* (2013.01); *G11C 16/08* (2013.01); *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 9,299,439 B2 | 3/2016 | Ghodsi | |
| 2008/0023747 A1* | 1/2008 | Park | G11C 11/5621 257/314 |
| 2013/0279256 A1 | 10/2013 | Costa et al. | |
| 2014/0063947 A1 | 3/2014 | Ghodsi | |

OTHER PUBLICATIONS

Caillat, et al.; "Erasing Memory Segments in a Memory Block of Memory Cells"; U.S. Appl. No. 14/943,541, filed Nov. 17, 2015; Total pp. 32.
J. Choi, et al., "3D Approaches for Non-volatile Memory," 2011 Symposium on VLSI Technology Digest of Technical Papers, Jun. 2011, pp. 178-179.

(Continued)

*Primary Examiner* — James G Norman
(74) *Attorney, Agent, or Firm* — Dicke, Billig & Czaja, PLLC

(57) ABSTRACT

Apparatus having a plurality of strings of series-connected memory cells, and methods of their operation, where each string of the plurality of strings is selectively connected to a common data line through a corresponding respective select gate. A first set of access lines are each coupled to a respective memory cell of each string of series-connected memory cells of the plurality of strings of series-connected memory cells. A second set of access lines are each coupled to a respective memory cell of each string of series-connected memory cells of only a portion of the plurality of strings of series-connected memory cells.

15 Claims, 12 Drawing Sheets

(56) References Cited

OTHER PUBLICATIONS

J. Jang, et al., "Vertical Cell Array using TCAT (Terabit Cell Array Transistor) Technology for Ultra High Denisty NAND Flash Memory," 2009 Symposium on VLSI Technology Digest of Technical Papers, Jun. 2009, pp. 192-193.
J. Kim, et al. "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, Jun. 2009, pp. 186-187.
T. K. Park, et al., "Three-Dimensional 128Gb MLC Vertical NAND Flash-Memory with 24-WL Stacked Layers and 50MB/s High-Speed Programming", 2014 IEEE International Solid-State Circuits Conference, Feb. 2014, pp. 334-335.
R. Katsumata, et al., "Pipe-shaped BiCS Flash memory with 16 Stacked Layers and Multi-Level-Cell Operation for Ultra High Density Storage Devices," 2009 Symposium on VLSI Technology Digest of Technical Papers, Jun. 2009, pp. 136-137.
W. Kim, et al., "Multi-Layered Vertical Gate NAND Flash Overcoming Stacking Limit for Terabit Density Storage," 2009 Symposium on VLSI Technology Digest of Technical Papers, Jun. 2009, pp. 188-189.
Y. Komori, et al., "Disturbless Flash Memory due to High Boost Efficientcy on BiCS Structure and Optimal Memory Film Stack for Ultra High Density Storage Device", 2008 IEEE International Electron Devices Meeting, Dec. 2008, pp. 1-4.
J. Im, et al., "A 128Gb 3b/cell V-NAND Flash Memory with 1Gb/s I/0 Rate", 2015 IEEE International Solid-State Circuits Conference, Feb. 2015, pp. 130-132.

\* cited by examiner

SEGMENTED MEMORY AND OPERATION

RELATED APPLICATIONS

This Application is a Continuation of U.S. application Ser. No. 15/241,740, titled "SEGMENTED MEMORY AND OPERATION," filed Aug. 19, 2016, issued as U.S. Pat. No. 9,773,553 on Sep. 26, 2017, which is commonly assigned and incorporated herein by reference.

TECHNICAL FIELD

The present disclosure relates generally to memory and, in particular, in one or more embodiments, the present disclosure relates to apparatus and methods of operating memory with memory segmentation.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select gate is connected to a source line, while each drain select gate is connected to a data line, such as column bit line.

To meet the demand for higher capacity memories, designers continue to strive for increasing memory density (e.g., the number of memory cells in a given area of an integrated circuit die). One way to increase the memory density is to form stacked memory arrays, e.g., often referred to as three-dimensional memory arrays. Operation of such memories having stacked memory arrays can present challenges not encountered in memory arrays formed at a single level.

DETAILED DESCRIPTION

Figure 1:
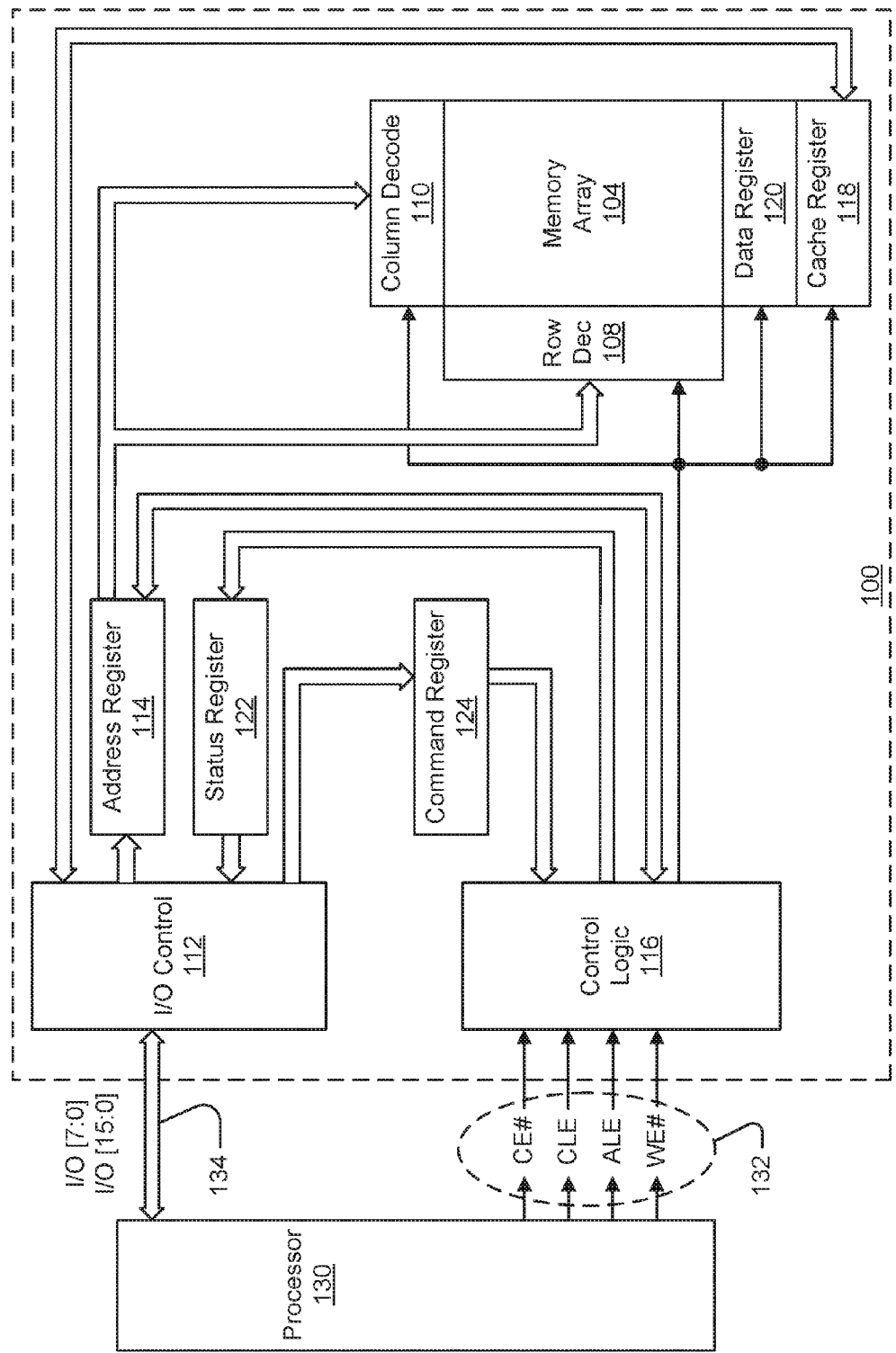
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are arranged in strings of series-connected memory cells. Blocks of memory cells (not shown in FIG. 1) generally include memory cells sharing a common set of access lines, and that might also share a common data line and a common source. Blocks of memory cells of at least a portion of array of memory cells 104 are segmented in a manner as described herein.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., read operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
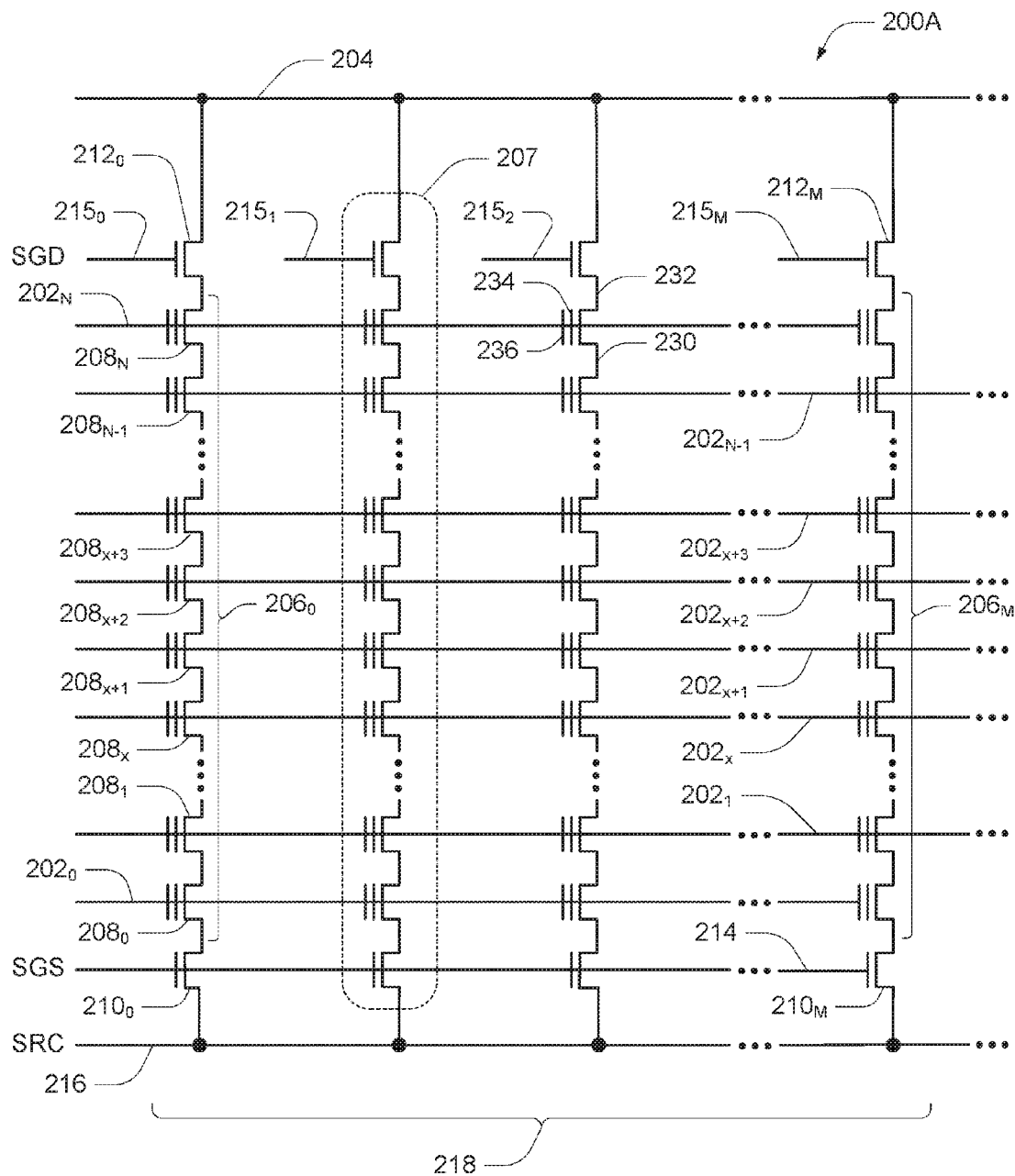
FIG. 2A is a schematic of a portion of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might include strings of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. Memory cells 208 may further represent non-volatile "dummy" memory cells. Dummy memory cells might be provided at the edges of the NAND strings 206, such as at word lines $202_0$ and $202_N$, and may act to reduce disturb effects on remaining memory cells 208 of the NAND strings 206, and to support connection to, or isolation from, the bit line 204 and/or the source 216. Dummy memory cells are typically not used to store data accessible to a user of the memory. There may be no intervening memory cells 208 between the edge word lines $202_0$ and $202_N$ and their nearest select gate 210 or 212, respectively.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be connected to respective select lines $215_0$ to $215_M$, such as drain select lines. Although depicted as traditional field-effect transistors, the select gates 210 and 212 may utilize a structure similar to (e.g., the same as) the memory cells 208.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to a respective select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

The portion of the array of memory cells 200A might represent a memory segment 218. The memory segment 218 may include a subset of a block of memory cells (not shown in FIG. 2A) that includes a plurality of memory sub-blocks 207 sharing at least one word line 202 (e.g., word line $202_0$ and/or word line $202_N$) that is not shared with other sub-blocks of the block of memory cells, and sharing at least one word line 202 (e.g., any of word lines $202_1$ to $202_{N-1}$) that is shared with other sub-blocks of the block of memory cells. The memory sub-blocks 207 may each include a NAND string 206 and its corresponding select gates 210 and 212 between a common bit line 204 and a common source 216. Throughout the remaining figures, like numbered elements correspond to the description as provided with respect to FIG. 2A.

Figure 2B:
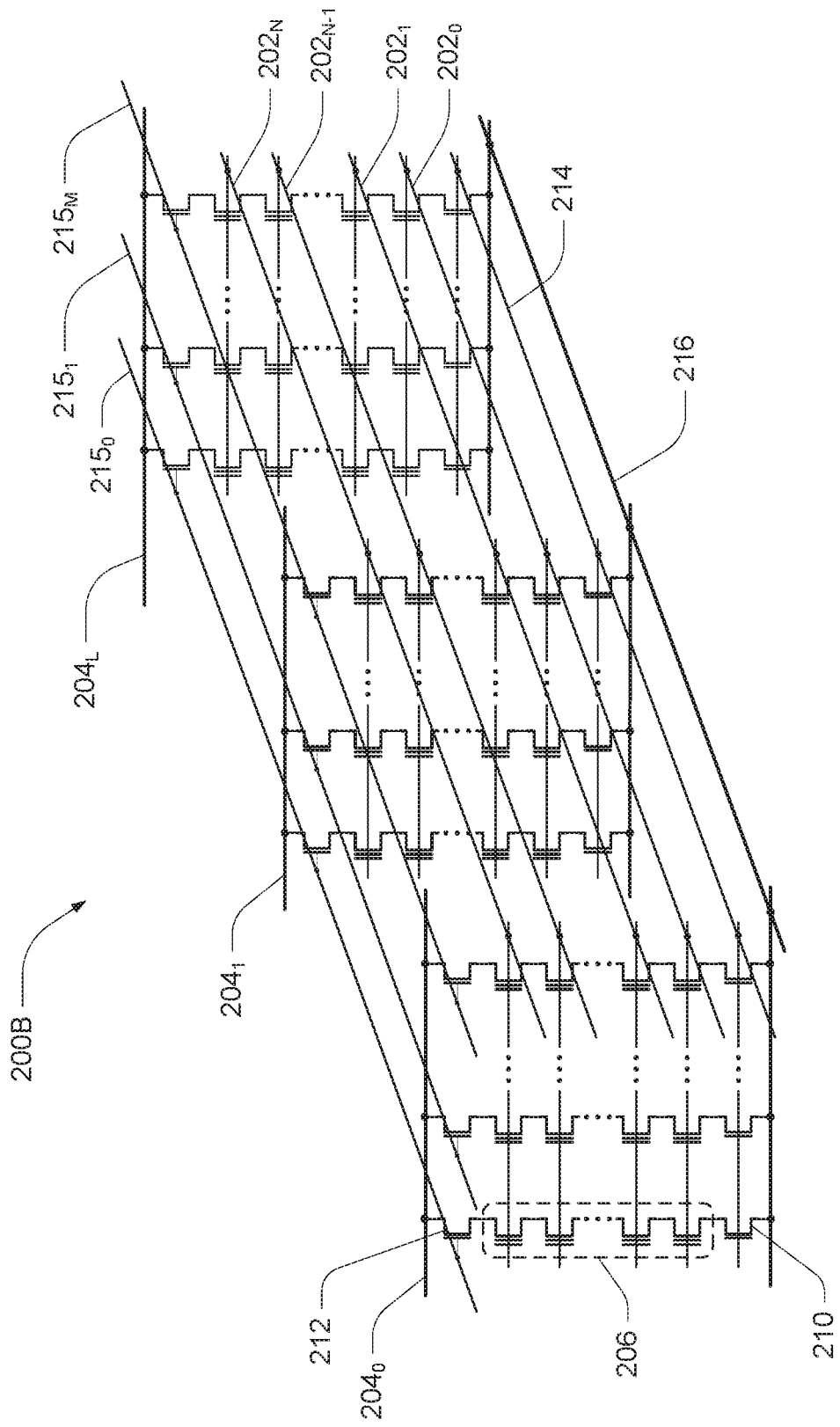
FIG. 2B is another schematic of a portion of an array of memory cells as could be used in a memory of the type described with reference to FIG. 1.

FIG. 2B is another schematic of a portion of an array of memory cells 200B as could be used in a memory of the type described with reference to FIG. 1, e.g., as a portion of array of memory cells 104. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_L$ by a select gate 212 (e.g., that may be drain select transistors, commonly referred to as select gate drain) and to a common source 216 by a select gate 210 (e.g., that may be source select transistors, commonly referred to as select gate source). Each word line 202 may be connected to multiple rows of memory cells of the memory array 200B. Rows of memory cells that are commonly connected to each other by a particular word line 202 may collectively be referred to as tiers.

Figure 2C:
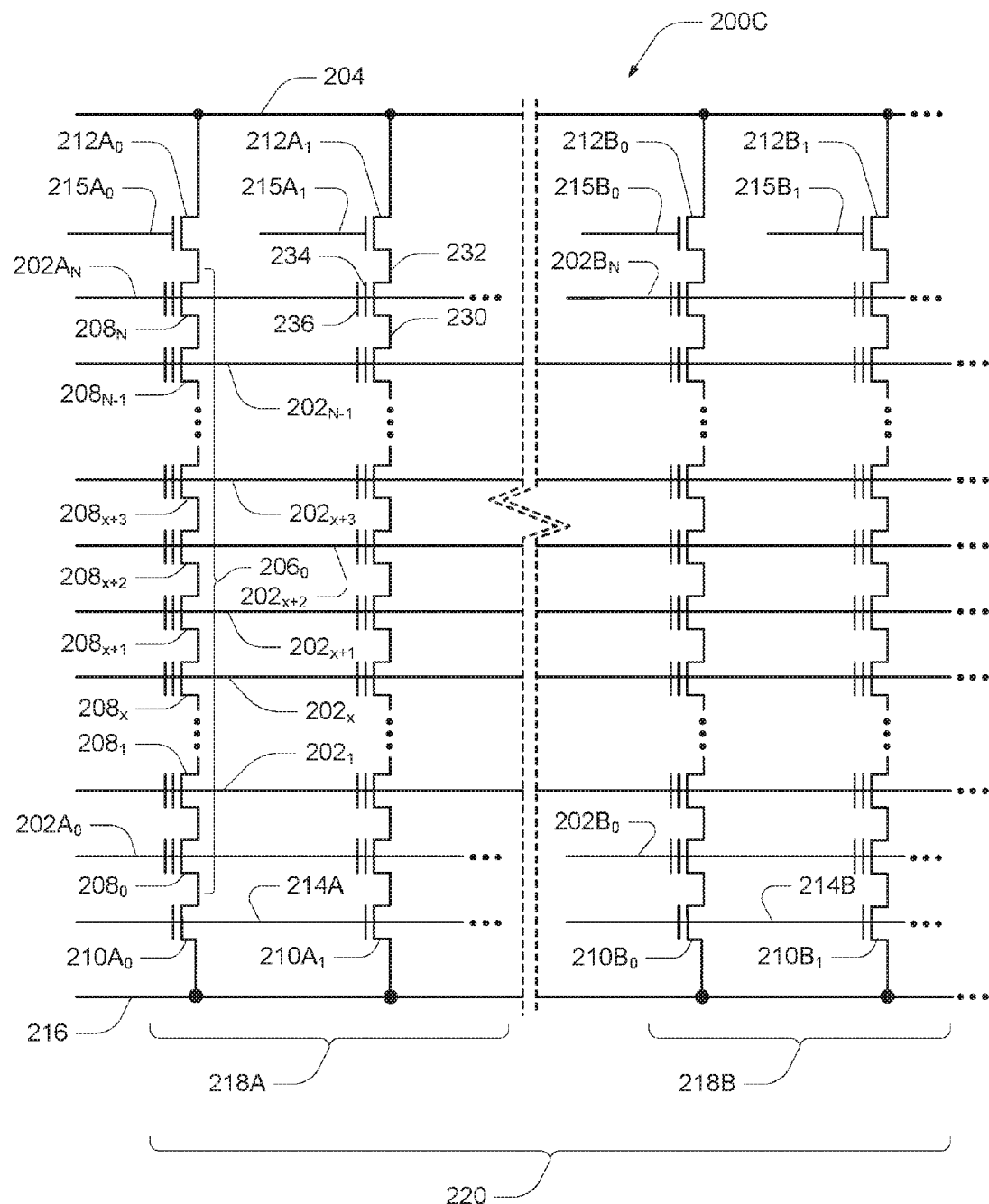
FIG. 2C is another schematic of a portion of an array of memory cells as could be used in a memory of the type described with reference to FIG. 1.

FIG. 2C is another schematic of a portion of an array of memory cells 200C as could be used in a memory of the type described with reference to FIG. 1, e.g., as a portion of array of memory cells 104. FIG. 2C depicts a block of memory cells 220 including a plurality of memory segments 218 (e.g., 218A and 218B). Although only two memory segments 218 are depicted in FIG. 2C, other numbers of memory segments 218 might be used.

Memory segment 218A includes a plurality of memory sub-blocks sharing at least one word line 202 (e.g., word line $202A_0$ and/or word line $202A_N$) that is not shared with sub-blocks of memory segment 218B or with other sub-blocks of the block of memory cells 220. Similarly, memory segment 218B includes a plurality of memory sub-blocks sharing at least one word line 202 (e.g., word line $202B_0$ and/or word line $202B_N$) that is not shared with sub-blocks of memory segment 218A or with other sub-blocks of the block of memory cells 220.

The memory sub-blocks of memory segment 218A further share at least one word line 202 (e.g., any of word lines $202_1$ to $202_{N-1}$) that is shared with sub-blocks of memory segment 218B, as well as other sub-blocks of the block of memory cells 220. Similarly, memory sub-blocks of memory segment 218B further share at least one word line 202 (e.g., any of word lines $202_1$ to $202_{N-1}$) that is shared with sub-blocks of memory segment 218A, as well as other sub-blocks of the block of memory cells 220.

In other words, the block of memory cells 220 includes a plurality of strings of series-connected memory cells 208, wherein each string of series-connected memory cells 208 of the block of memory cells 220 is selectively connected to a common bit line 204 through a corresponding respective select gate 212 and selectively connected to a common source 216 through a corresponding respective select gate 210. Each string of series-connected memory cells 208 of the block of memory cells 220 may include a number of positions corresponding to its number of memory cells 208. Each position might be thought of as occurring at a respective level of physical space in which the block of memory cells 220 is formed. A particular position of each string of series-connected memory cells 208 of the block of memory cells may include its corresponding memory cell 208 coupled to a particular word line 202. For example, the memory cells 208 coupled to the word lines $202A_0$ and $202B_0$ might have the same position within their respective strings of series-connected memory cells 208 (and may be formed at the same physical level), the memory cells 208 coupled to the word line $202_1$ might have the same position within their respective strings of series-connected memory cells 208 (and may be formed at the same physical level), the memory cells 208 coupled to the word line $202_2$ might have the same position within their respective strings of series-connected memory cells 208 (and may be formed at the same physical level), and so on.

The block of memory cells 220 includes a word line 202 coupled to a respective memory cell 208 of a particular position of each string of series-connected memory cells 208 of the plurality of strings of series-connected memory cells 208. For example, word lines $202_1$-$202_{N-1}$ are each coupled to memory cells 208 of their corresponding positions for each of the strings of series-connected memory cells 208 of the block of memory cells 220. In addition, the block of memory cells 220 includes a word line 202 coupled to a respective memory cell 208 of a different position of each string of series-connected memory cells 208 of a subset of strings of series-connected memory cells 208 of the block of memory cells 220. For example, word lines $202A_0$ and $202A_N$ are each coupled to memory cells 208 of their corresponding positions for each of the strings of series-connected memory cells 208 of the memory segment 218A, while word lines $202B_0$ and $202B_N$ are each coupled to memory cells 208 of their corresponding positions for each of the strings of series-connected memory cells 208 of the memory segment 218B.

In the example of FIG. 2C, the memory sub-blocks of memory segments 218A and 218B are each independently selectively connected to the common bit line 204, while the memory sub-blocks of memory segment 218A are selectively connected to the common source 216 in response to a single control signal from select line 214A, and the memory sub-blocks of memory segment 218B are selectively connected to the common source 216 in response to a single control signal from select line 214B. Segmentation in this manner can facilitate reductions in capacitance of the word lines 202 during operation. For example, when accessing (e.g., reading) a target memory cell in memory segment 218A (e.g., memory cell $208_1$), the source select gates $210A_0$ and $210A_1$ may be activated to connect the memory sub-blocks of memory segment 218A to the source 216, while the source select gates $210B_0$ and $210B_1$ may be deactivated to isolate the memory sub-blocks of the memory segment 218B (as well as any other memory segments 218 of the block of memory cells 220) from the source 216.

While isolation of the memory sub-blocks of memory segments 218 not containing a memory cell targeted for access may facilitate reductions in capacitance of the word lines 202 used for the access operation, this can also promote hot electron injection in memory cells of the edge word lines. Thus, by operating word lines of unselected memory segments 218 and not coupled to the target memory cell (e.g., those word lines, such as dummy word lines, directly connected to a select gate) independently of other word lines, the conditions promoting hot electron injection might be mitigated.

Figure 3A:
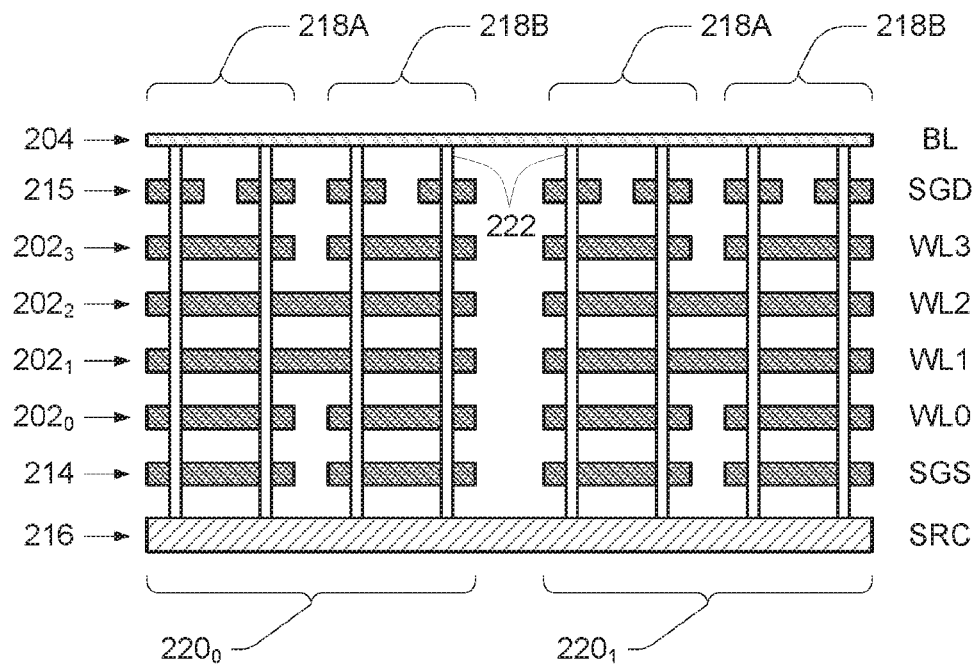
FIGS. 3A-3C are conceptual depictions of blocks of memory cells of an array of memory cells as could be used in a memory of the type described with reference to FIG. 1.
Figure 3B:
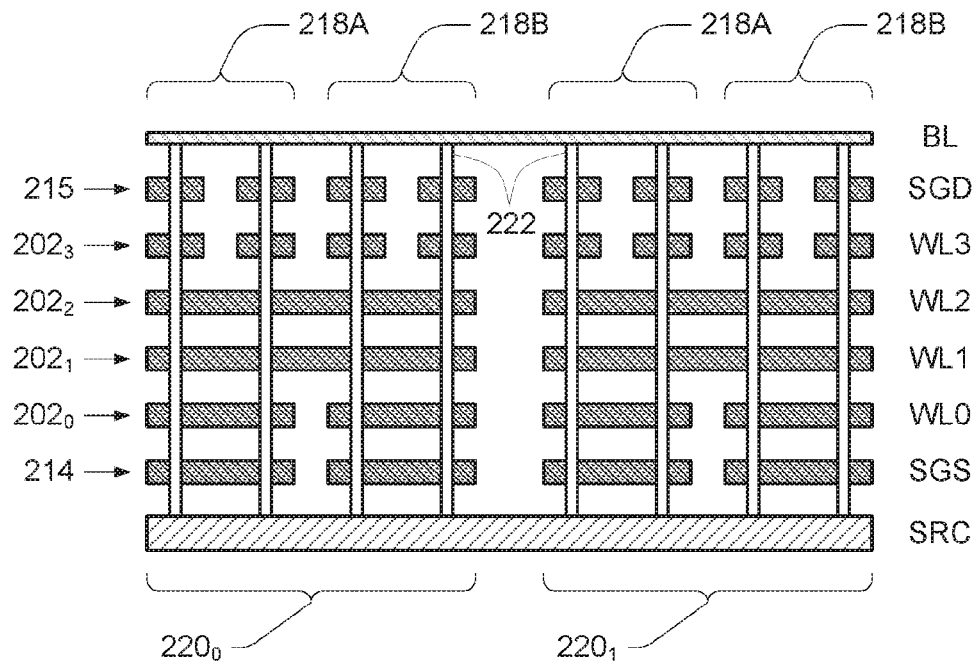
Figure 3C:
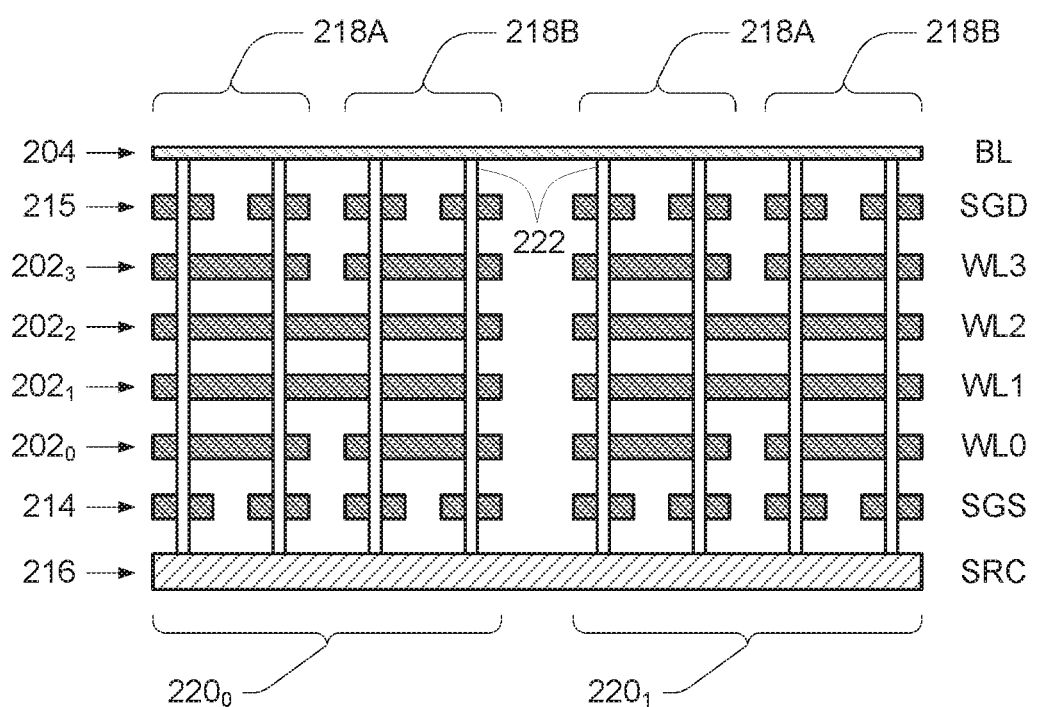

FIGS. 3A-3C depict conceptually blocks of memory cells 220 sharing a common bit line 204 and common source 216 having various configurations of memory segments 218. While two blocks of memory cells 220 are depicted in each of FIGS. 3A-3C, and while two memory segments 218 are depicted for each block of memory cells 220, other numbers of blocks of memory cells 220 may share a common bit line 204 and blocks of memory cells 220 may contain other numbers of memory segments 218. Similarly, while four word lines 202 are depicted for each block of memory cells 220 in each of FIGS. 3A-3C, other numbers of word lines 202 may be used. The figures have been simplified, but it is to be understood that a memory cell may occur at each intersection of a word line 202 and a channel 222 and a select gate may occur at each intersection of a select line 214 or 215 and a channel 222.

FIGS. 3A-3C each depict a respective example where each block of memory cells 220 (e.g., $220_0$ and $220_1$) includes four memory sub-blocks, and each memory segment 218 (e.g., 218A and 218B) includes a respective subset of those four memory sub-blocks (e.g., two memory sub-blocks in each). In the example of FIG. 3A, the select lines 214 and the word lines $202_0$ and $202_3$ (e.g., the edge word lines) of each memory segment 218 are coupled to the same memory sub-blocks of their respective memory segment 218.

In the example of FIG. 3B, the select lines 214 and the word lines $202_0$ of each memory segment 218 are coupled to the same memory sub-blocks of their respective memory segment 218, while the word lines $202_3$ of each memory segment 218 are each coupled to a respective subset of those memory sub-blocks of their respective memory segment 218 (e.g., each of the word lines $202_3$ being coupled to one memory sub-block of a memory segment 218). In the example of FIG. 3B, the structure of the memory cells at the position corresponding to the word lines $202_3$ and the structure of the memory cells at the position corresponding to the word lines $202_0$ might be swapped, with two word lines $202_0$ in a memory segment 218 each coupled to a single memory sub-block and with one word line $202_3$ in a memory segment 218 each coupled to two memory sub-blocks. Alternatively, the structure of the memory cells at the position corresponding to the word lines $202_0$ might utilize the structure of the memory cells at the position corresponding to the word lines $202_3$, with two word lines $202_0$ in a memory segment 218 each coupled to a single memory sub-block.

In the example of FIG. 3C, the word lines $202_0$ and $202_3$ of each memory segment 218 are coupled to the same memory sub-blocks of their respective memory segment 218, while the select lines 214 of each memory segment 218 are each coupled to a respective subset of those memory sub-blocks of their respective memory segment 218 (e.g., each of the select lines 214 being coupled to one memory sub-block of a memory segment 218).

Figure 4A:
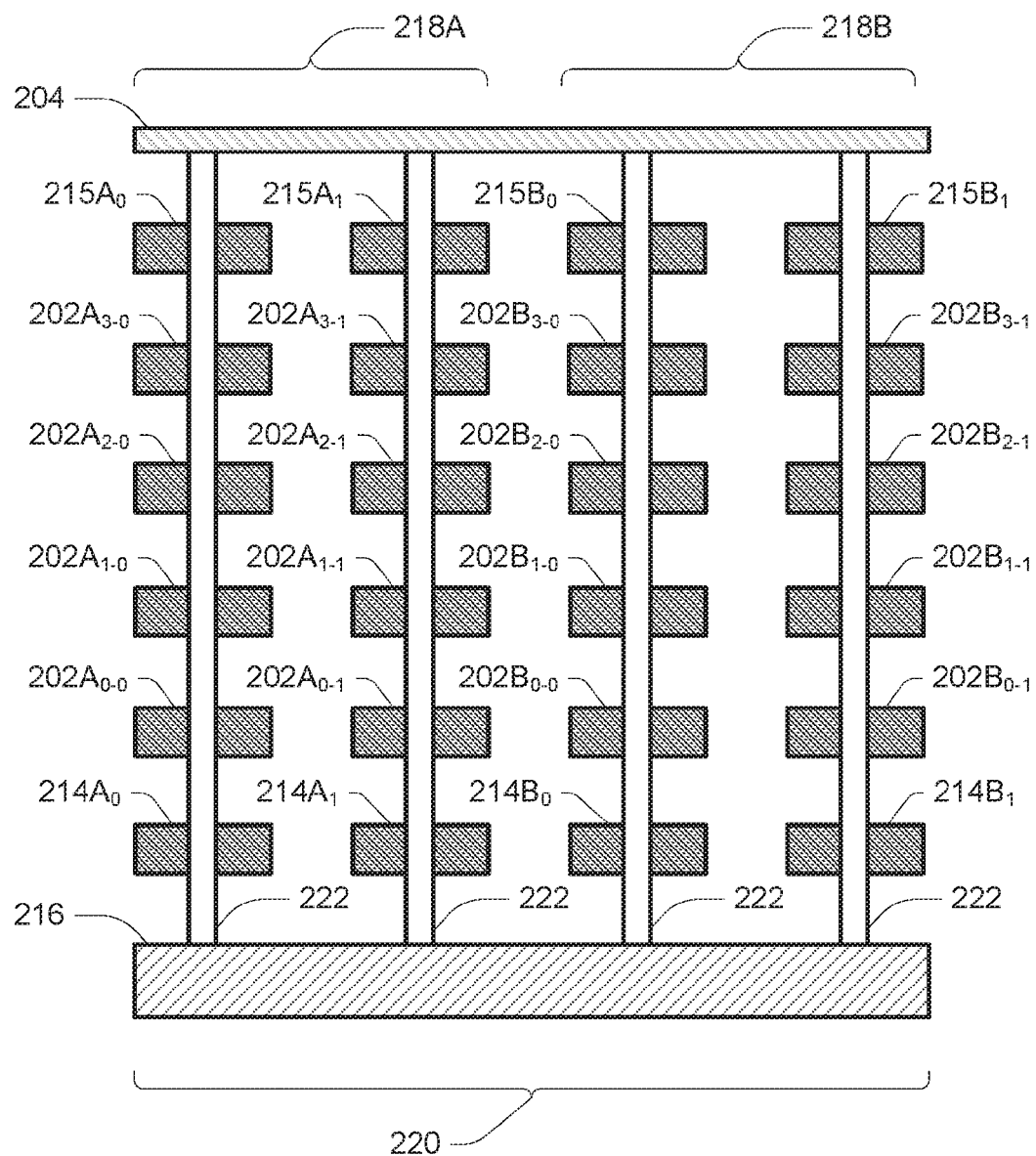
FIGS. 4A-4B are conceptual depictions of blocks of memory cells of an array of memory cells as could be used in a memory of the type described with reference to FIG. 1.

While the examples of FIGS. 3A-3C depict word lines 202 spanning across multiple sub-blocks, and sub-blocks having linear channels 222 between the bit line 204 and the source 216, other structures are possible. FIG. 4A depicts a block of memory cells having a structure where each word line 202 is coupled to a single memory sub-block (and thus to a string of series-connected memory cells), and each select line 214 and 215 is coupled to a single memory sub-block. However, the word lines 202 and select lines 214 and 215 may extend into the face of the drawing, allowing them to be connected, e.g., outside the array of memory cells, to provide the connectivity of the types previously described. For example, FIGS. 5A-5D are top-down views of the structure of FIG. 4A showing the extensions of the various word lines 202 and select lines 214 and 215, and providing connectivity within the memory segments 218 in a manner similar to that shown in FIG. 3A.

Figure 5A:
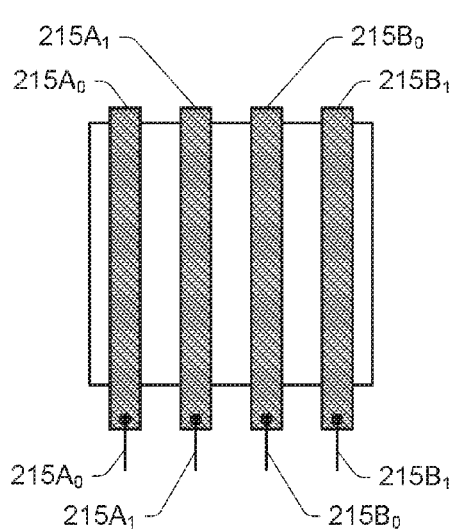
FIGS. 5A-5D are top-down views of the structure of FIG. 4A showing connections in accordance with an embodiment.
Figure 5B:
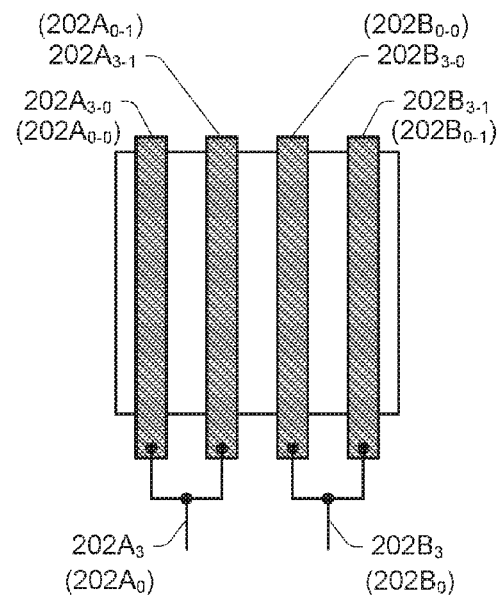
Figure 5C:
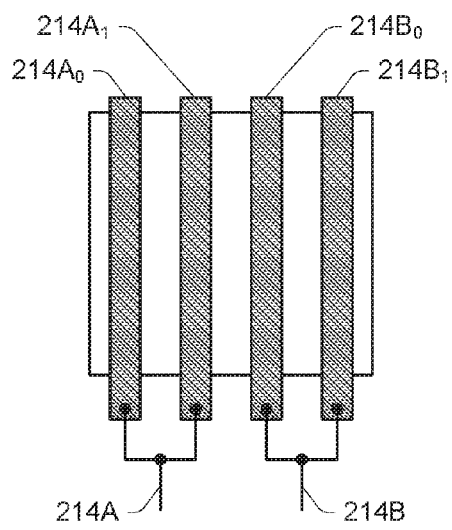
Figure 5D:
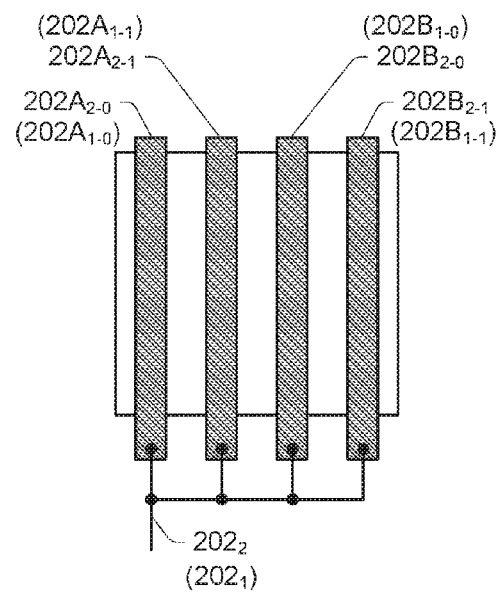

As shown in FIG. 5A, each select line 215 (e.g., $215A_0$, $215A_1$, $215B_0$ and $215B_1$) can be coupled to a single memory sub-block as shown in FIG. 3A. As shown in FIG. 5B, each pair of edge word lines 202 for each memory segment 218 (e.g., $202A_{0\text{-}0}$ and $202A_{0\text{-}1}$; $202A_{3\text{-}0}$ and $202A_{3\text{-}1}$; $202B_{0\text{-}0}$ and $202B_{0\text{-}1}$; and $202B_{3\text{-}0}$ and $202B_{3\text{-}1}$) can be connected together to each act as a single edge word line 202 (e.g., $202A_0$, $202A_3$, $202B_0$, and $202B_3$, respectively) coupled to two memory sub-blocks each. Similarly, each pair of select lines 214 for each memory segment 218 (e.g., $214A_0$ and $214A_1$; and $214B_0$ and $214B_1$) can be connected together to each act as a single select line 214 (e.g., 214A and 214B, respectively) coupled to two memory sub-blocks each. All other word lines 202 for a particular position of their respective strings of series-connected memory cells (e.g., $202A_{1\text{-}0}$ and $202A_{1\text{-}1}$; $202A_{2\text{-}0}$ and $202A_{2\text{-}1}$; $202B_{1\text{-}0}$ and $202B_{1\text{-}1}$; and $202B_{2\text{-}0}$ and $202B_{2\text{-}1}$) can be connected together to each act as a single word line 202 (e.g., $202_1$ and $202_2$, respectively) coupled to all four memory sub-blocks each. It will be clear that other connections could be used to result in equivalent circuits to those shown in other examples, such as those of FIGS. 3B and 3C.

Figure 4B:
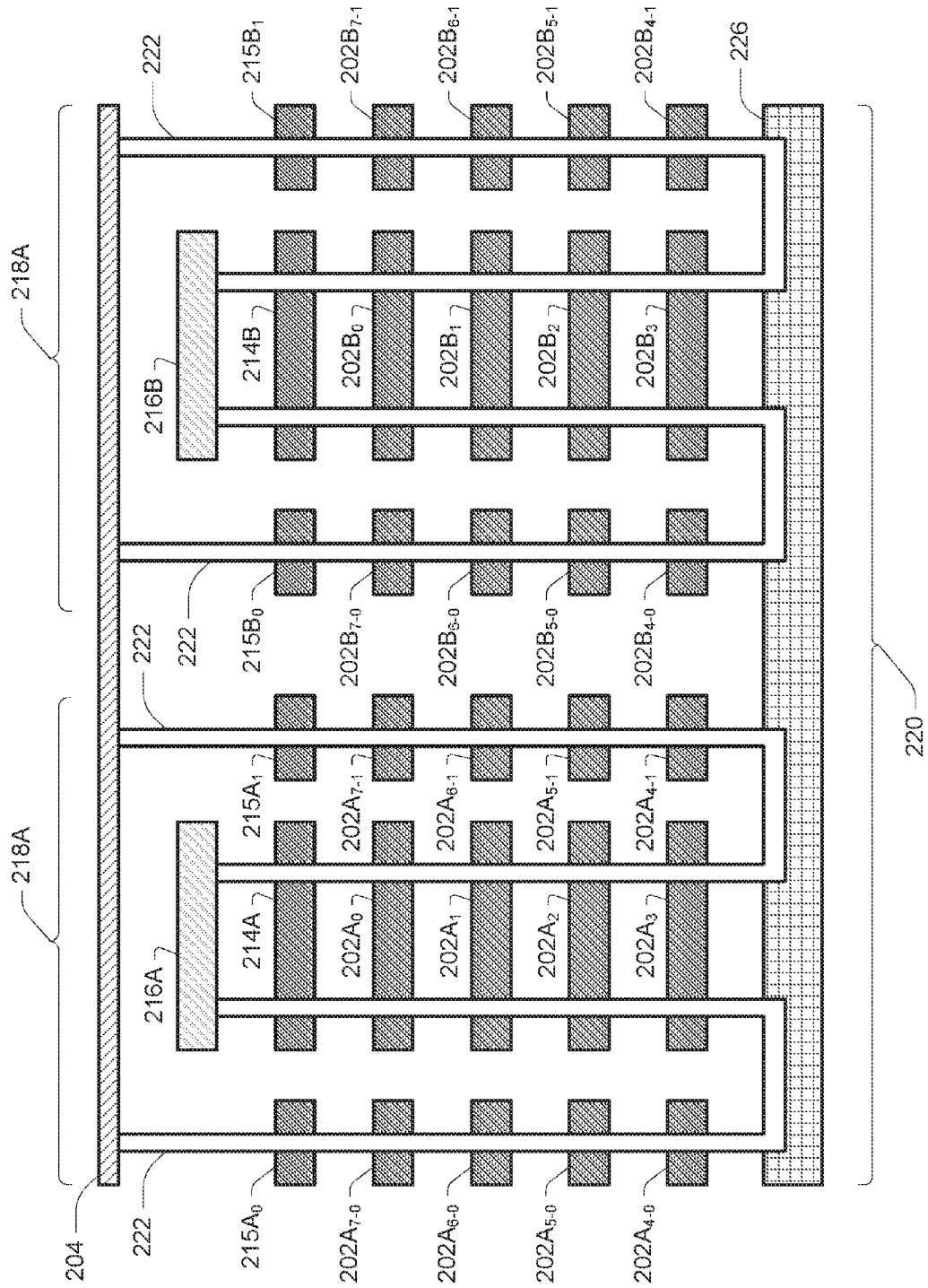

FIG. 4B depicts a block of memory cells formed over a substrate 226 and having a structure where each string of series-connected memory cells has a U-shape channel 222 between a source 216 (e.g., source 216A or 216B) and a bit line 204. As with the structure of FIG. 4A, the word lines 202 and select lines 214 and 215 may extend into the face of the drawing, allowing them to be connected, e.g., outside the array of memory cells, to provide the connectivity of the types previously described. FIGS. 6A-6D are top-down views of the structure of FIG. 4B showing the extensions of the various word lines 202 and select lines 214 and 215, and providing connectivity within the memory segments 218 in a manner similar to that shown in FIG. 3A. The value Y in FIG. 6D can represent the values 1, 2 or 3 while the value Z in FIG. 6D can represent the values 6, 5 or 4, respectively.

Figure 6A:
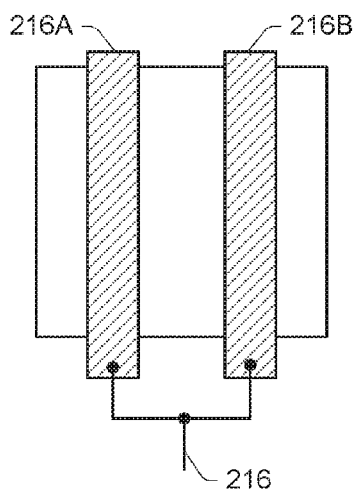
FIGS. 6A-6D are top-down views of the structure of FIG. 4B showing connections in accordance with an embodiment.
Figure 6B:
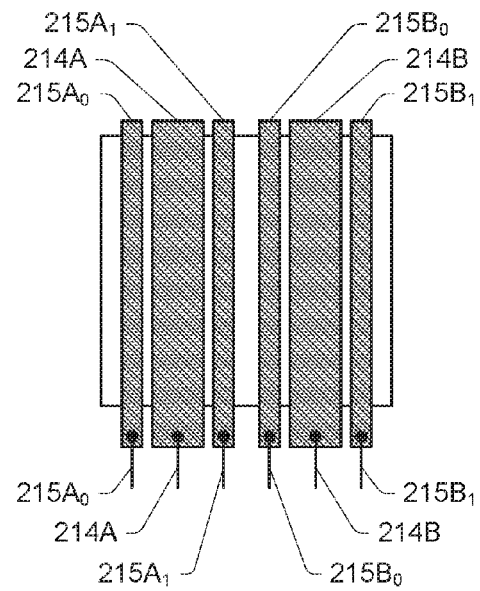
Figure 6C:
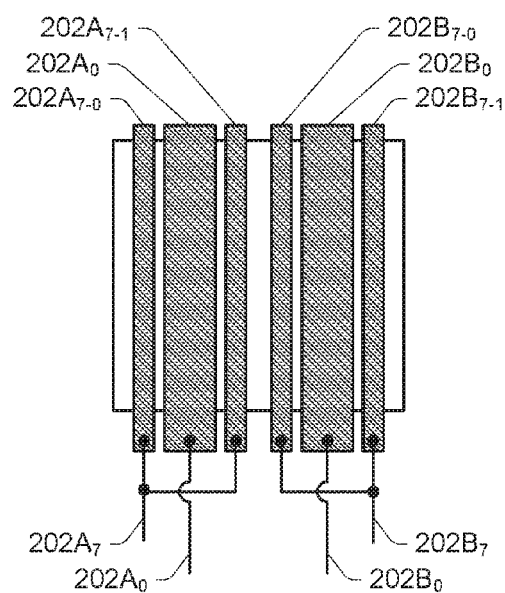
Figure 6D:
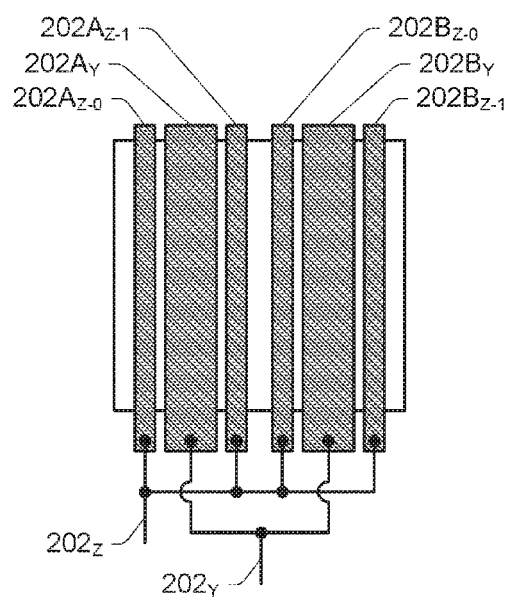

As shown in FIG. 6A, each source 216 (e.g., 216A and 216B) can be connected together to act as a single common source 216 for the block of memory cells 220. As shown in FIG. 6B, each select line 215 (e.g., $215A_0$, $215A_1$, $215B_0$ and $215B_1$) can be coupled to a single memory sub-block as shown in FIG. 3A. In addition, each select line 214 (e.g., 214A and 214B) can be coupled to two memory sub-blocks as shown in FIG. 3A. As shown in FIG. 6C, each pair of edge word lines 202 closest to the select line 215 (and, thus, the bit line 204) for each memory segment 218 (e.g., $202A_{7-0}$ and $202A_{7-1}$; and $202B_{7-0}$ and $202B_{7-1}$) can be connected together to each act as a single edge word line 202 (e.g., $202A_7$ and $202B_7$, respectively) coupled to two memory sub-blocks each. Similarly, each of the edge word lines 202 closest to the select line 214 (and, thus, the source 216) for each memory segment 218 (e.g., $202A_0$ and $202B_0$) can be coupled to two memory sub-blocks each. All other word lines 202 for a particular position of their respective strings of series-connected memory cells (e.g., $202A_1$ and $202B_1$; $202A_2$ and $202B_2$; $202A_3$ and $202B_3$; $202A_{4-0}$, $202A_{4-1}$, $202B_{4-0}$ and $202B_{4-1}$; $202A_{5-0}$, $202A_{5-1}$, $202B_{5-0}$ and $202B_{5-1}$; and $202A_{6-0}$, $202A_{6-1}$, $202B_{6-0}$ and $202B_{6-1}$) can be connected together to each act as a single word line 202 (e.g., $202_1$, $202_2$, $202_3$, $202_4$, $202_5$ and $202_6$, respectively) coupled to all four memory sub-blocks each. It will be clear that other connections could be used to result in equivalent circuits to those shown in other examples, such as that of FIG. 3B and, if the select lines 214 of FIG. 4B were coupled to individual memory sub-blocks similar to the select lines 215, the example of 3C.

Figure 7:
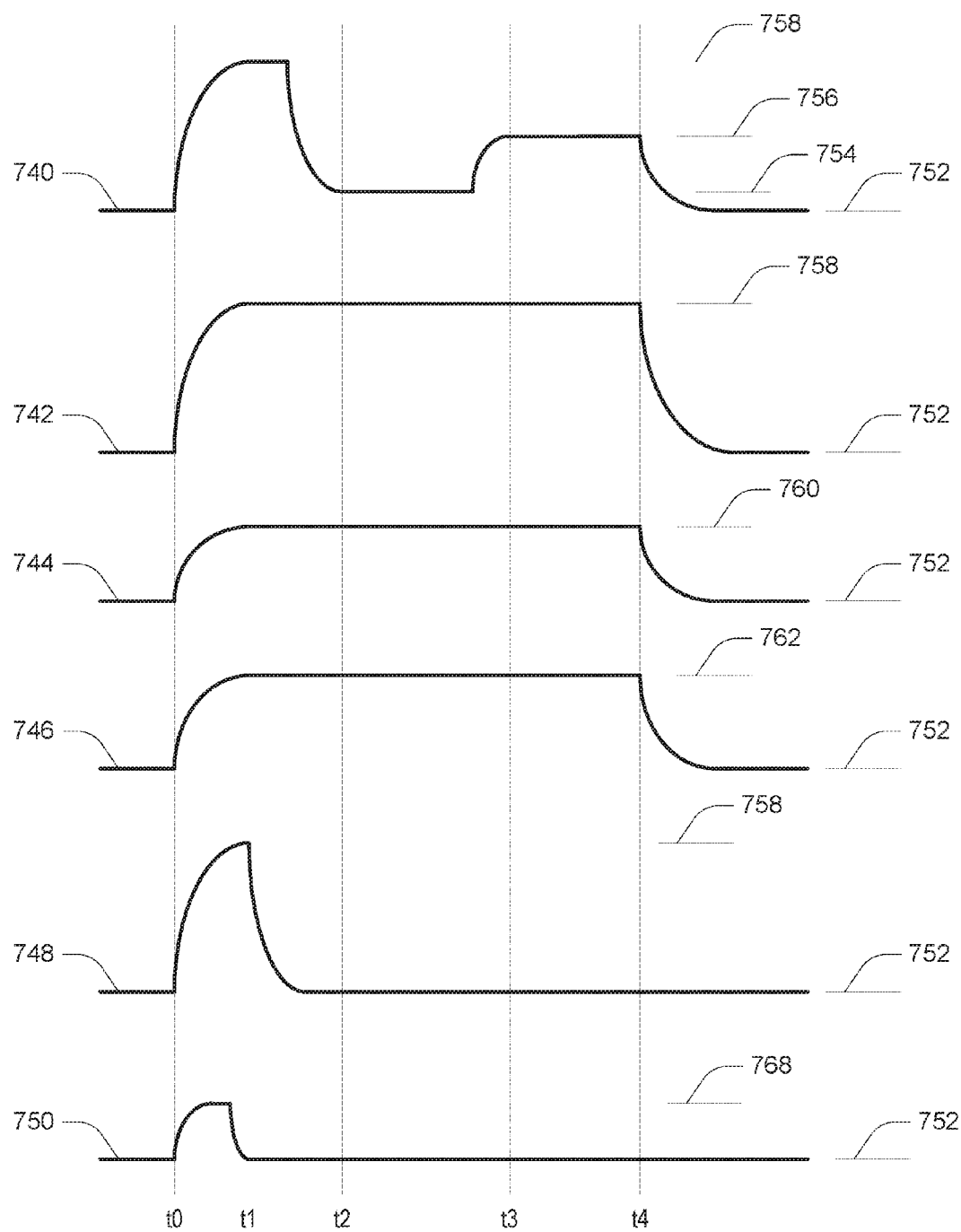
FIG. 7 depicts a timing diagram for an access operation in accordance with an embodiment.

FIG. 7 depicts a timing diagram for an access operation in accordance with an embodiment. For example, the timing diagram of FIG. 7 might represent a read operation. Trace 740 might represent the voltage level applied to a word line coupled to a memory cell selected for the read operation, e.g., a target memory cell. The following discussion will be made with reference to at least FIG. 2C and will presume that the memory cell selected for the read operation is the memory cell $208_X$ of the NAND string $206_0$, such that trace 740 might represent the voltage level applied to word line $202_X$. The word line $202_X$ may be referred to as the selected word line as it contains the target memory cell, while remaining word lines 202 may be referred to as unselected word lines. The NAND string $206_0$, may be referred to as the selected string of series-connected memory cells as it contains the target memory cell. Memory segment 218A may be referred to as the selected memory segment as it contains the target memory cell, while remaining memory segments 218 of the block of memory cells 220, e.g., memory 218B in the example of FIG. 2C, may be referred to as unselected memory segments.

Trace 742 might represent the voltage level applied to the unselected word lines 202 of the selected memory segment 218A, e.g., word lines $202A_0$, $202_1$-$202_{X-1}$, $202_{X+1}$-$202_{N-1}$, and $202A_N$. Trace 744 might represent the voltage level applied to the unselected edge word lines of the unselected memory segments 218, e.g., the word lines $202B_0$ and $202B_N$. Trace 746 might represent the voltage level applied to the select line 215 coupled to the memory sub-block containing the target memory cell and the voltage level applied to the select line(s) 214 of the selected memory segment 218A, e.g., select line $215A_0$ and select line 214A. Trace 748 might represent the voltage level applied to the select line(s) 215 coupled to memory sub-blocks of the selected memory segment that do not contain the target memory cell, e.g., select line $215A_1$. And trace 750 might represent the voltage level applied to the select lines 214 and 215 of the unselected memory segments 218, e.g., 214B, $215B_0$ and $215B_1$.

At time t0, a precharge phase might begin. As shown in the example of FIG. 7, all word lines 202 of the selected memory segment 218A and the are initially brought up to a voltage level 758. The voltage level 758 may be sufficient to activate each memory cell coupled to one of the word lines 202 regardless of their data state. As one example, voltage level 758 might be approximately 8V. Bringing all of the word lines 202 of the selected memory segment 218 up together in this manner may facilitate improvements in speed to steady state of any word line 202 whose desired voltage level is the voltage level 758. The select lines 215 of the selected memory segment 218A and not coupled to the memory sub-block containing the target memory cell might also be brought up to a voltage level less than or equal to the voltage level 758. The select line 215 coupled to the memory sub-block containing the target memory cell and select line(s) 214 of the selected memory segment 218A might be brought up to a voltage level 762. The edge word lines of the unselected memory segment 218B might be brought up to a voltage level 760, and the select lines 214 and 215 of the unselected memory segment 218B might be brought up to a voltage level 768. The voltage level 768 might be chosen to be less than the voltage level 758 and greater than the voltage level 752. The voltage level 768 might be chosen to balance competing interests of reducing word line capacitance by isolating unselected memory segments 218 from the source 216 and reducing hot electron injection of the memory cells of the edge word lines 202 of the unselected memory segments, where lower levels of the voltage level 768 tend to reduce word line capacitance while higher levels of the voltage level 768 tend to reduce hot electron injection concerns. As one example, the voltage level 768 might be approximately 3V.

At or around time t1, the selected word line $202_X$ might be discharged to a voltage level 754, while the select lines 215 of the selected memory segment 218A and not coupled to the memory sub-block containing the target memory cell, and the select lines 214 and 215 of the unselected memory segments 218, might be discharged to the voltage level 752. The voltage level 752 might represent a reference potential, e.g., Vss or ground. The voltage level 754 might represent a read voltage intended to distinguish between possible data states of the selected memory cell. For example, if the target memory cell is activated while the voltage level 754 is applied to the word line $202_X$, and thus to the control gate of the target memory cell, it may be deemed to have a data state corresponding to a range of threshold voltages below the voltage level 754. If the target memory cell is activated while the voltage level 754 is applied to the word line $202_X$, it may be deemed to have a data state corresponding to a range of threshold voltages above the voltage level 754. A sensing operation might be performed while the voltage level 754 is being applied, as is well understood in the art. As one example, the voltage level 754 might be approximately 1V.

While the voltage level 754 is being applied to the selected word line 202$_X$ at time t2, the voltage level 758 is being applied to the unselected word lines 202A$_0$, 202$_1$-202$_{X-1}$, 202$_{X+1}$-202$_{N-1}$, and 202A$_N$. The voltage level 758 is sufficient to activate the memory cells coupled to these unselected word lines regardless of their data state. In addition, while the voltage level 754 is being applied to the selected word line 202$_X$ at time t2, the voltage level 762 is being applied to the select line 215 coupled to the memory sub-block containing the target memory cell and to the select line(s) 214 of the selected memory segment 218A. The voltage level 762 is sufficient to activate the select gates coupled to these select lines. In this manner, current flow may be established through the string of series-connected memory cells if the target memory cell is activated, thus permitting sensing of its data state. As one example, the voltage level 762 might be approximately 5V.

In addition, while the voltage level 754 is being applied to the selected word line 202$_X$ at time t2, a voltage level, e.g., voltage level 752, is applied to the select lines 215 of the selected memory segment 218A not coupled to the memory sub-block containing the target memory cell. This applied voltage level should be sufficient to deactivate the select gates coupled to these select lines 215 such that only one memory sub-block is connected to an individual bit line 204 while the voltage level 754 is being applied to the selected word line 202$_X$. Similarly, a voltage level, e.g., voltage level 752, is applied to the select lines 214 and 215 of the unselected memory segment 218B. This applied voltage level should be sufficient to deactivate the select gates coupled to these select lines. Furthermore, while the voltage level 754 is being applied to the selected word line 202$_X$ at time t2, a voltage level 762 is applied to the edge word lines 202 of the unselected memory segment 218B. The voltage level 762 might be chosen to be less than the voltage level 758 and greater than the voltage level 752. The voltage level 768 might be chosen to reduce the electrical field across the memory cells coupled to these word lines, and thus reduce hot electron injection concerns. For example, the voltage level 760 might be chosen to be approximately midway between the voltage level 758 and the voltage level 752. As one example, the voltage level 760 might be approximately 4V.

At time t3, the voltage level applied to the selected word line 202$_X$ might be increased to the voltage level 756 while voltage levels of the other traces 742-750 are maintained. The voltage level 756 might represent a different read voltage intended to distinguish between different possible data states of the selected memory cell. A sensing operation might be performed while the voltage level 756 is being applied, as is well understood in the art. As one example, the voltage level 756 might be approximately 4V. While only two read voltages are depicted in FIG. 7, other numbers of read voltages might be used. In general, for every K possible data states for a memory cell, K-1 read voltages might be used to distinguish between each of the K possible data states. At time t4, all of the lines might be discharged to the voltage level 752.

Figure 8:
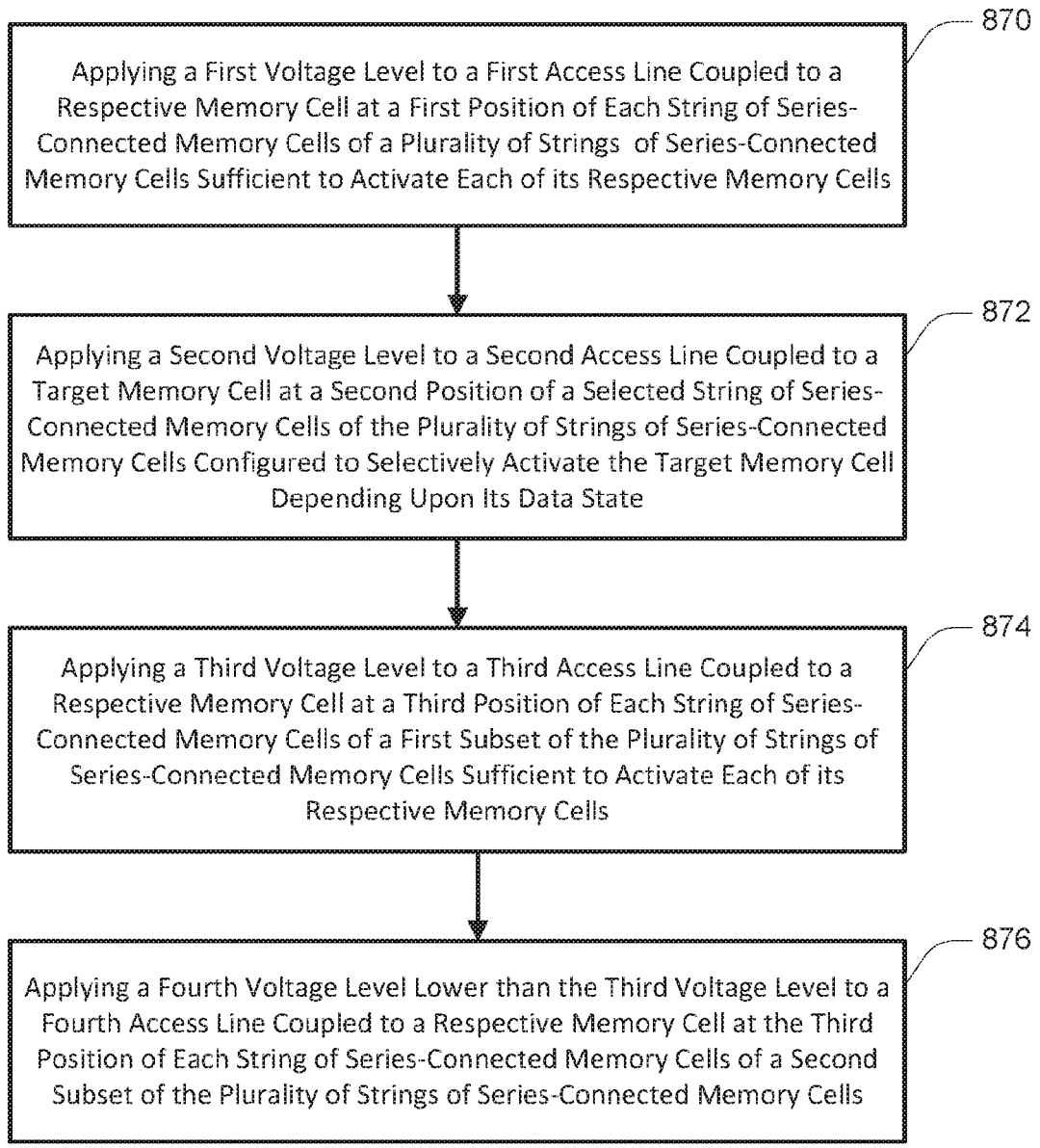
FIG. 8 is a flowchart of a method of operating a memory in accordance with an embodiment.

FIG. 8 is a flowchart of a method of operating a memory in accordance with an embodiment. For example, the method of FIG. 8 may be part of an access operation, e.g., a read operation, on a target memory cell of the NAND string 206$_0$ of FIG. 2C. At 870, a first voltage level is applied to a first access line coupled to a respective memory cell at a first position of each string of series-connected memory cells of a plurality of strings of series-connected memory cells sufficient to activate each of its respective memory cells. With reference to FIG. 2C as an example, the first voltage level might be applied to any of the word lines 202$_0$-202$_N$ not containing a memory cell selected for access, e.g., selected for reading.

At 872, a second voltage level is applied to a second access line coupled to a target memory cell at a second position of a selected string of series-connected memory cells of the plurality of strings of series-connected memory cells configured to selectively activate the target memory cell depending upon its data state. With reference to FIG. 2C as an example, the first voltage level might be applied to the word line of the word lines 202$_0$-202$_N$ that contains the memory cell selected for reading.

At 874, a third voltage level is applied to a third access line coupled to a respective memory cell at a third position of each string of series-connected memory cells of a first subset of the plurality of strings of series-connected memory cells sufficient to activate each of its respective memory cells. With reference to FIG. 2C as an example, the third voltage level might be applied to either of the word lines 202A$_0$ or 202A$_N$. The first subset of the plurality of strings of series-connected memory cells might be those strings of series-connected memory cells of the memory segment 218A. The plurality of strings of series-connected memory cells might be those strings (e.g., all strings) of series-connected memory cells of the block of memory cells 220.

At 876, a fourth voltage level lower than the third voltage level is applied to a fourth access line coupled to a respective memory cell at the third position of each string of series-connected memory cells of a second subset of the plurality of strings of series-connected memory cells. With reference to FIG. 2C as an example, the fourth voltage level might be applied to either of the word lines 202B$_0$ or 202B$_N$, as well as any word lines of the same positions if other memory segments 218 (not directly pictured) of the block of memory cells 220. The second subset of the plurality of strings of series-connected memory cells might be those strings of series-connected memory cells of the block of memory cells 220 not contained in the memory segment 218A. The first subset of the plurality of strings of series-connected memory cells and the second subset of the plurality of strings of series-connected memory cells may be mutually exclusive. A union of the first subset of the plurality of strings of series-connected memory cells and the second subset of the plurality of strings of series-connected memory cells might include each string of series-connected memory cells of the plurality of series-connected memory cells. Alternatively, a union of the first subset of the plurality of strings of series-connected memory cells and the second subset of the plurality of strings of series-connected memory cells might include less than all strings of series-connected memory cells of the plurality of series-connected memory cells.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. An apparatus, comprising:
a plurality of strings of series-connected memory cells, each string of series-connected memory cells of the plurality of strings of series-connected memory cells selectively connected to a common data line through a corresponding respective select gate;
a first set of access lines each coupled to a respective memory cell of each string of series-connected memory cells of the plurality of strings of series-connected memory cells; and
a second set of access lines each coupled to a respective memory cell of each string of series-connected memory cells of only a portion of the plurality of strings of series-connected memory cells;
wherein each access line of the first set of access lines is between a first access line of the second set of access lines and a second access line of the second set of access lines.

2. The apparatus of claim 1, wherein each access line of the first set of access lines is between a first access line of the second set of access lines and a second access line of the second set of access lines, and between a first access line of the third set of access lines and a second access line of the third set of access lines.

3. An apparatus, comprising:
a plurality of strings of series-connected memory cells, each string of series-connected memory cells of the plurality of strings of series-connected memory cells selectively connected to a common data line through a corresponding respective select gate;
a first set of access lines each coupled to a respective memory cell of each string of series-connected memory cells of the plurality of strings of series-connected memory cells; and
a second set of access lines each coupled to a respective memory cell of each string of series-connected memory cells of only a portion of the plurality of strings of series-connected memory cells;
wherein the portion of the plurality of strings of series-connected memory cells is a first portion of the plurality of strings of series-connected memory cells, the apparatus further comprising a third set of access lines each coupled to a respective memory cell of each string of series-connected memory cells of only a second portion of the plurality of strings of series-connected memory cells; and
wherein the second portion of the plurality of strings of series-connected memory cells is mutually exclusive to the first portion of the plurality of strings of series-connected memory cells.

4. An apparatus, comprising:
a plurality of strings of series-connected memory cells, each string of series-connected memory cells of the plurality of strings of series-connected memory cells selectively connected to a common data line through a corresponding respective select gate;
a first set of access lines each coupled to a respective memory cell of each string of series-connected memory cells of the plurality of strings of series-connected memory cells; and
a second set of access lines each coupled to a respective memory cell of each string of series-connected memory cells of only a portion of the plurality of strings of series-connected memory cells;
wherein the portion of the plurality of strings of series-connected memory cells is a first portion of the plurality of strings of series-connected memory cells, the apparatus further comprising a third set of access lines each coupled to a respective memory cell of each string of series-connected memory cells of only a second portion of the plurality of strings of series-connected memory cells;
wherein a union of the first portion of the plurality of strings of series-connected memory cells and the second portion of the plurality of strings of series-connected memory cells includes each string of series-connected memory cells of the first portion of the plurality of strings of series-connected memory cells; and
wherein each access line of the first set of access lines is between an access line of the second set of access lines and an access line of the third set of access lines.

5. An apparatus, comprising:
a plurality of strings of series-connected memory cells, each string of series-connected memory cells of the plurality of strings of series-connected memory cells selectively connected to a common data line through a corresponding respective select gate;
a first set of access lines each coupled to a respective memory cell of each string of series-connected memory cells of the plurality of strings of series-connected memory cells; and
a second set of access lines each coupled to a respective memory cell of each string of series-connected memory cells of only a portion of the plurality of strings of series-connected memory cells;
wherein an access line of the second set of access lines and an access line of the third set of access lines are formed at a same physical level of the plurality of strings of series-connected memory cells.

6. An apparatus, comprising:
a plurality of strings of series-connected memory cells, each string of series-connected memory cells of the plurality of strings of series-connected memory cells selectively connected to a common data line through a corresponding respective select gate;
a first set of access lines each coupled to a respective memory cell of each string of series-connected memory cells of the plurality of strings of series-connected memory cells; and
a second set of access lines each coupled to a respective memory cell of each string of series-connected memory cells of only a portion of the plurality of strings of series-connected memory cells;
wherein each access line of the second set of access lines is formed at a same physical level of the plurality of strings of series-connected memory cells.

7. A method of operating a memory, comprising:
activating a respective memory cell of each string of series-connected memory cells of a plurality of strings of series-connected memory cells;
selectively activating a target memory cell of a selected string of series-connected memory cells of the plurality of strings of series-connected memory cells depending upon its data state;
deactivating a respective memory cell of each string of series-connected memory cells of a first subset of the plurality of strings of series-connected memory cells; and
activating a respective memory cell of each string of series-connected memory cells of a second subset of the plurality of strings of series-connected memory cells formed at a same physical level as the respective memory cell of each string of series-connected memory cells of the first subset of the plurality of strings of series-connected memory cells.

8. The method of claim 7, wherein activating the respective memory cell of each string of series-connected memory cells of the second subset of the plurality of strings of series-connected memory cells comprises applying a particular voltage level to a control gate of the respective memory cell of each string of series-connected memory cells of the second subset of the plurality of strings of series-connected memory cells comprises, and wherein deactivating the respective memory cell of each string of series-connected memory cells of the first subset of the plurality of strings of series-connected memory cells comprises applying a different voltage level, lower than the particular voltage level, to a control gate of the respective memory cell of each string of series-connected memory cells of the first subset of the plurality of strings of series-connected memory cells.

9. The method of claim 8, wherein applying the different voltage level comprises applying a voltage level that is between the particular voltage level and a reference potential.

10. The method of claim 8, wherein applying the different voltage level comprises applying a voltage level that is midway between the particular voltage level and a reference potential.

11. The method of claim 7, wherein the second subset of the plurality of strings of series-connected memory cells comprises the selected string of series-connected memory cells.

12. The method of claim 11, further comprising:
disconnecting each string of series-connected memory cells of the first subset of the plurality of strings of series-connected memory cells from a source while selectively activating the target memory cell; and
connecting each string of series-connected memory cells of the second subset of the plurality of strings of series-connected memory cells to the source while selectively activating the target memory cell.

13. The method of claim 11, further comprising:
connecting the selected string of series-connected memory cells to a data line while selectively activating the target memory cell;
disconnecting each string of series-connected memory cells of the second subset of the plurality of strings of series-connected memory cells other than the selected string of series-connected memory cells from the data line while selectively activating the target memory cell; and
disconnecting each string of series-connected memory cells of the first subset of the plurality of strings of series-connected memory cells from the data line while selectively activating the target memory cell.

14. An apparatus, comprising:
an array of memory cells comprising a block of memory cells; and
a controller for access of memory cells of the array of memory cells;
wherein the block of memory cells comprises:
a plurality of strings of series-connected memory cells, wherein each string of series-connected memory cells of the plurality of strings of series-connected memory cells is selectively connected to a common data line by a respective select gate;
a first set of access lines each coupled to a respective memory cell of each string of series-connected memory cells of the plurality of strings of series-connected memory cells;
a second set of access lines each coupled to a respective memory cell of each string of series-connected memory cells of a first subset of the plurality of strings of series-connected memory cells; and
a third set of access lines each coupled to a respective memory cell of each string of series-connected memory cells of a second subset of the plurality of strings of series-connected memory cells,
wherein the first subset of the plurality of strings of series-connected memory cells and the second subset of the plurality of strings of series-connected memory cells are mutually exclusive.

15. The apparatus of claim 14, wherein a union of the first subset of the plurality of strings of series-connected memory cells and the second subset of the plurality of strings of series-connected memory cells includes each string of series-connected memory cells of the first subset of the plurality of strings of series-connected memory cells.

* * * * *